United States Patent
Lee et al.

(10) Patent No.: US 7,586,159 B2
(45) Date of Patent: Sep. 8, 2009

(54) SEMICONDUCTOR DEVICES HAVING DIFFERENT GATE DIELECTRICS AND METHODS FOR MANUFACTURING THE SAME

(75) Inventors: Jong-Ho Lee, Suwon-si (KR); Ho-Kyu Kang, Yongin-si (KR); Yun-Seok Kim, Gangnam-gu (KR); Seok-Joo Doh, Suwon-si (KR); Hyung-Suk Jung, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 113 days.

(21) Appl. No.: 11/723,705

(22) Filed: Mar. 21, 2007

(65) Prior Publication Data

US 2007/0176242 A1 Aug. 2, 2007

Related U.S. Application Data

(62) Division of application No. 10/930,943, filed on Sep. 1, 2004.

(30) Foreign Application Priority Data

Nov. 12, 2003 (KR) ............... 2003-0079908

(51) Int. Cl.
*H01L 29/94* (2006.01)

(52) U.S. Cl. .............. 257/369; 257/204; 257/410; 257/406; 257/411; 257/325; 257/324; 257/E27.046; 257/E27.064

(58) Field of Classification Search ............. 257/310, 257/368, 370, 374, 406, 410, 411, E21.01, 257/E31.123, 204, 369, 325, 324, E27.046, 257/E27.064
See application file for complete search history.

(56) References Cited

U.S. PATENT DOCUMENTS

| | | | |
|---|---|---|---|
| 5,763,922 | A | 6/1998 | Chau |
| 6,064,102 | A | 5/2000 | Gardner et al. |
| 6,261,978 | B1 | 7/2001 | Chen et al. |
| 6,495,422 | B1 | 12/2002 | Yu et al. |
| 6,528,858 | B1 | 3/2003 | Yu et al. |
| 6,555,879 | B1 * | 4/2003 | Krivokapic et al. ......... 257/382 |
| 6,563,183 | B1 | 5/2003 | En et al. |
| 6,670,248 | B1 | 12/2003 | Ang et al. |

(Continued)

FOREIGN PATENT DOCUMENTS

| | | |
|---|---|---|
| KR | 1020040003211 A | 1/2004 |
| KR | 1020050045737 | 5/2005 |
| WO | WO 02082554 | * 10/2002 |

*Primary Examiner*—Victor A. Mandala
*Assistant Examiner*—William Harriston
(74) *Attorney, Agent, or Firm*—Volentine & Whitt, PLLC

(57) ABSTRACT

A semiconductor device includes first and second transistor devices. The first device includes a first substrate region, a first gate electrode, and a first gate dielectric. The first gate dielectric is located between the first substrate region and the first gate electrode. The second device includes a second substrate region, a second gate electrode, and a second gate dielectric. The second gate dielectric is located between the second substrate region and the second gate electrode. The first gate dielectric includes a first high-k layer having a dielectric constant of 8 or more. Likewise, the second gate dielectric includes a second high-k layer having a dielectric constant of 8 or more. The second high-k layer has a different material composition than the first high-k layer.

16 Claims, 19 Drawing Sheets

U.S. PATENT DOCUMENTS

| | | |
|---|---|---|
| 6,727,130 B2 | 4/2004 | Kim et al. |
| 6,809,370 B1 | 10/2004 | Colombo et al. |
| 6,812,101 B2 * | 11/2004 | Moriwaki et al. ........... 438/287 |
| 6,841,439 B1 | 1/2005 | Anthony et al. |
| 6,872,613 B1 | 3/2005 | Xiang et al. |
| 6,890,811 B2 * | 5/2005 | Hou et al. ................... 438/216 |
| 6,897,095 B1 | 5/2005 | Adetutu et al. |
| 6,897,134 B2 | 5/2005 | Brask et al. |
| 2002/0190302 A1 | 12/2002 | Bojarczuk et al. |
| 2004/0106249 A1 | 6/2004 | Huotari |
| 2005/0042846 A1 | 2/2005 | Green et al. |
| 2005/0098839 A1* | 5/2005 | Lee et al. ..................... 257/410 |
| 2005/0158940 A1 | 7/2005 | Lee et al. |
| 2005/0269634 A1 | 12/2005 | Bojarczuk et al. |
| 2007/0059872 A1 | 3/2007 | Visokay et al. |

* cited by examiner

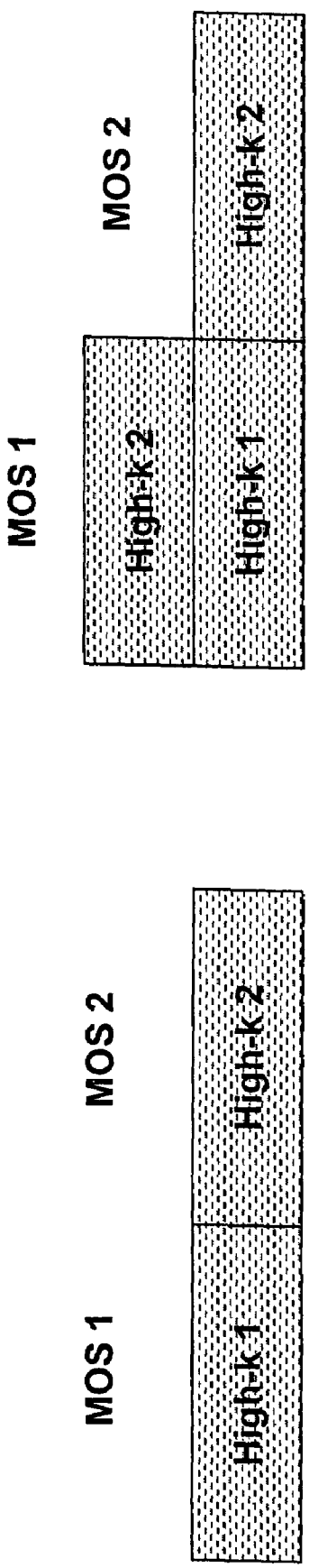
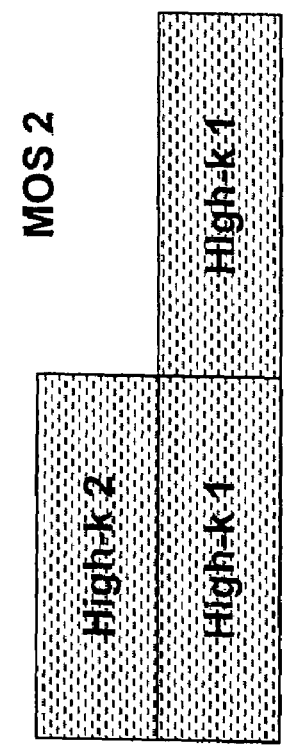
FIG. 1(A)
FIG. 1(B)
FIG. 1(C)

SEMICONDUCTOR DEVICES HAVING DIFFERENT GATE DIELECTRICS AND METHODS FOR MANUFACTURING THE SAME

CROSS-REFERENCE TO RELATED APPLICATION(S)

This is a Divisional of, and a claim of priority is made to, U.S. non-provisional application Ser. No. 10/930,943, filed Sep. 1, 2004.

BACKGROUND OF THE INVENTION

1. Field of the Invention

The present invention generally relates to transistor devices, and more particularly, the present invention relates to devices having transistors containing respectively different high-k gate dielectrics, and to processes for forming such devices.

2. Description of the Related Art

Conventional transistor devices, such as metal-oxide-semiconductor (MOS) devices, are characterized by a gate dielectric of silicon dioxide ($SiO_2$) interposed between a gate electrode and a channel region. The performance of such devices can be improved by increasing the capacitance between the gate electrode and channel region, and one common method by which the capacitance has been increased is to decrease the thickness of the $SiO_2$ gate dielectric below 100 angstroms. In fact, the thickness of the gate dielectric is currently approaching 40 angstroms. Unfortunately, however, at around this thickness, the use of $SiO_2$ as a gate dielectric becomes limited. This is because direct tunneling through the $SiO_2$ dielectric to the channel region can occur in the case where the SiO2 dielectric is less than about 40 angstroms. The result is increased leakage current and increased power consumption.

Accordingly, methods have been sought to reduce leakage current while achieving a high gate capacitance. One method investigated by the industry is the use of materials having a high dielectric constant (high-k or high-$\in$) for the gate dielectric layer. Generally, gate capacitance (C) is proportional to permitivity ($\in$) and inversely proportional to thickness (t) (i.e., $C = \in A/t$, where A is a constant). Thus, an increase in thickness (t) (e.g., to 40 angstroms or more) for reducing leakage current can be offset by the high permitivity ($\in$).

However, the use of high-k dielectrics for gate dielectric layers suffers drawbacks when used in MOS devices containing both PMOS and NMOS transistors. This is at least partly because high dielectric materials contain a greater number of bulk traps and interface traps than thermally grown $SiO_2$. These traps adversely affect the threshold voltage (Vt) characteristics of the PMOS and NMOS devices. Therefore, the industry has been seeking a solution to enable fabrication of reliable high-k gate dielectric layers while minimizing the number of bulk and interface traps.

SUMMARY OF THE INVENTION

According to one aspect of the present invention, semiconductor device is provided which includes first transistor including a first substrate region, a first gate electrode, and a first gate dielectric located between the first substrate region and the first gate electrode. The device further includes second transistor including a second substrate region, a second gate electrode, and a second gate dielectric located between the second substrate region and the second gate electrode. The first gate dielectric includes a first high-k layer having a dielectric constant of 8 or more, and the second gate dielectric comprises a second high-k layer having a dielectric constant of 8 or more, and the second high-k layer has a different material composition than the first high-k layer.

According to another aspect of the present invention, a semiconductor device is provided which includes a substrate, an NMOS transistor located at a surface of the substrate, and a PMOS transistor located at the surface of the substrate. The NMOS transistor includes a hafnium oxide layer, a first gate electrode, and first source/drain regions, and the PMOS transistor includes an aluminum oxide layer and a second hafnium oxide layer, a second gate electrode, and second source/drain regions.

According to another aspect of the present invention, a method of manufacturing a semiconductor device is provided which includes forming an NMOS device including forming a first gate dielectric over a first substrate region, and forming a first gate electrode over the first gate dielectric, and forming a PMOS device including forming a second gate dielectric over a second substrate region, and forming a second gate electrode over the second gate dielectric. The first gate dielectric includes a first high-k layer having a dielectric constant of 8 or more, the second gate dielectric includes a second high-k layer having a dielectric constant of 8 or more, and the second high-k layer has a different material composition than the first high-k layer.

According to yet another aspect of the present invention, a method of manufacturing a semiconductor device is provided which includes forming a first high-k material layer over a first region and a second region of a substrate, forming a second high-k material layer over the first high-k material layer, forming a mask to cover a first portion of the second high-k material layer located over the second region of the substrate, exposing a first portion the first high-k material layer located over the first region of the substrate by removing a second portion of the second high-k material layer exposed by the mask, removing the mask to expose the first portion of the second high-k material layer, and forming first and second gate electrodes over the first portion of the first high-k material layer and the first portion of the second high-k material layer, respectively. The first high-k material layer has a dielectric constant of 8 or more, the second high-k material layer having a dielectric constant of 8 or more, and the second high-k material layer has a different material composition than the first high-k material layer.

According to still another aspect of the present invention, a method of manufacturing a semiconductor device is provided which includes forming a first high-k material layer over a first region and a second region of a substrate, forming a mask to cover a first portion of the first high-k material layer located over the first region of the substrate, removing a second portion of the first high-k material layer exposed by the mask and located over the second region of the substrate, removing the mask to expose the first portion of the first high-k material layer, forming a second high-k material layer over the first portion of the first high-k material layer and over the second region of the substrate, and forming first and second gate electrodes over a first portion of the second high-k material layer located over the first region and a second portion of the second high-k material layer located over the second region, respectively. The first high-k material layer has a dielectric constant of 8 or more, the second high-k material layer having a dielectric constant of 8 or more, and the second high-k material layer has a different material composition than the first high-k material layer.

According to another aspect of the present invention, a method of manufacturing a semiconductor device is provided which includes forming a first high-k material layer over a first region and a second region of a substrate, forming a mask to cover a first portion of the first high-k material layer located over the first region of the substrate, removing a second portion of the first high-k material layer exposed by the mask and located over the second region of the substrate, removing the mask to expose the first portion of the first high-k material layer, forming a second high-k material layer over the first portion of the first high-k material layer and over the second region of the substrate, forming a mask over a first portion of the second high-k material located over the second region, removing a second portion of the second high-k material layer exposed by the mask and located over the first region of the substrate, removing the mask to expose the first portion of the second high-k material layer, and forming first and second gate electrodes over a first portion of the first high-k material layer and the first portion of the second high-k material layer, respectively. The first high-k material layer has a dielectric constant of 8 or more, the second high-k material layer having a dielectric constant of 8 or more, and the second high-k material layer has a different material composition than the first high-k material layer.

In accordance with these and other aspects of embodiments of the present invention, adequate capacitance can be accomplished in the transistor devices, for example, in NMOS and PMOS devices, while mitigating the negative impact of bulk traps and/or interface traps. These advantages can be accomplished by a first high-k layer and a second high-k layer having materials with dielectric constants of 8 or more. Also, this may be accomplished by the first high-k layer and the second high-k layer having different material compositions. Accordingly, semiconductor device with these attributes can operate at a higher speed and minimize leakage currents. In other words, desirable threshold voltage operation of the transistor devices can be accomplished, while maintaining adequate capacitance, to enable fast and reliable operation of a memory device. Further, thickness of a gate dielectric can minimize impurity penetration (e.g. boron).

BRIEF DESCRIPTION OF THE DRAWINGS

The features and advantages of the present invention will become readily apparent from the detailed description that follows, with reference to the accompanying drawings, in which:

FIGS. 1(A), 1(B) and 1(C) are schematic illustrations of PMOS and NMOS gate dielectrics according to embodiments of the present invention;

DETAILED DESCRIPTION OF THE PREFERRED EMBODIMENTS

Figure 2:
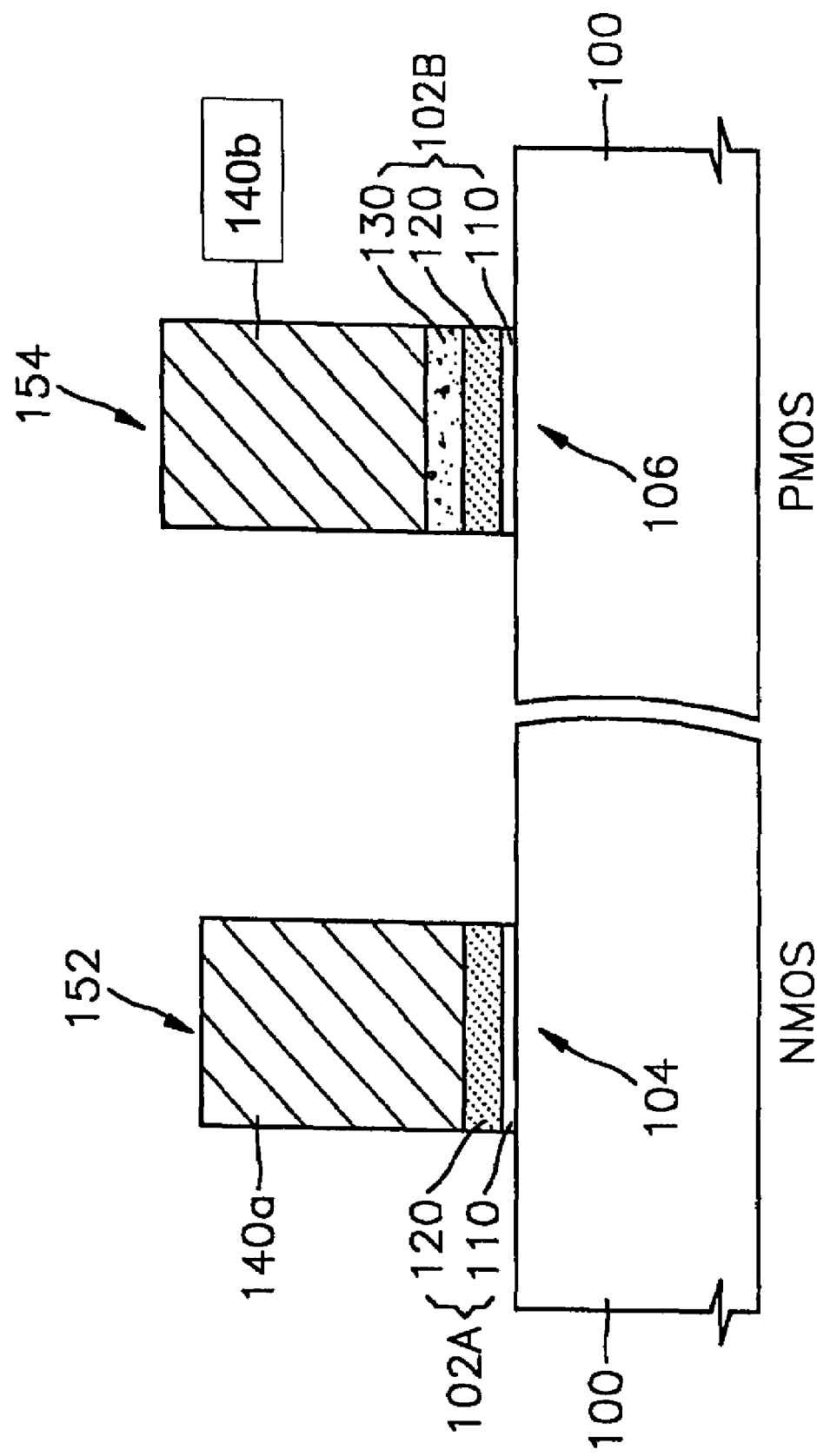
FIG. 2 is a schematic cross-sectional view of an MOS device according to one embodiment of the present invention.

The present invention will now be described with reference to the drawings by way of several preferred but non-limiting embodiments. It is noted that relative dimensions as illustrated in the drawings may not scale to actual dimensions.

FIGS. 1(A), 1(B) and 1(C) are simplified conceptual illustrations of embodiments of gate dielectrics used in MOS devices according to the present invention.

FIG. 1(A) illustrates the gate dielectrics of a semiconductor device including a first type of metal-oxide-semiconductor (MOS 1) and a second type of metal-oxide-semiconductor device (MOS 2). In some embodiments, MOS 1 is an n-channel metal-oxide-semiconductor (NMOS) device and MOS 2 is a p-channel metal-oxide-semiconductor (PMOS) device. In other embodiments, MOS 1 is a PMOS device and MOS 2 is an NMOS device. In the example of FIG. 1(A), the gate dielectric of MOS 1 is a first high-k dielectric material (High-k 1), and the gate dielectric of MOS 2 is a second high-k dielectric material (High-k 1). In embodiments, High-k 1 and High-k 2 each have a dielectric constant of 8 or more. Further, in embodiments, the material composition of High-k 1 and High-k 2 are different. As examples only, High-k 1 may be hafnium oxide ($HfO_2$) and High-k 2 may be aluminum oxide ($Al_2O_3$).

The embodiment of FIG. 1(B) is similar to the embodiments illustrated in example FIG. 1(A), except that the gate dielectric of MOS 1 further includes the High-k 2 material over the High-k 1 material. In this example, High-k 1 of MOS 1 and High-k 2 of MOS 2 lie in a same plane.

The embodiment of FIG. 1(C) differs from the previous examples in that MOS 1 includes the High-k 2 material over the High-k 1 material and MOS 2 includes the High-k 1 material. In this example, High-k 1 of MOS 1 and High-k 1 of MOS 2 lie in a same plane.

With respect to the examples of FIGS. 1(A), 1(B), and 1(C), one of ordinary skill in the art would appreciate other layers in the gate dielectric, and other adjacent structures. Although, FIGS. 1(A), 1(B), and 1(C) illustrate MOS 1 and MOS 2 as being contiguous, MOS 1 and MOS 2 may be separated and the contiguous feature of these illustrations is for simplicity purposes. Additionally, one of ordinary skill in the art would appreciate other materials and material combinations without departing from the scope and spirit of embodiments of the present invention.

Non-limiting embodiments of different semiconductor devices according to embodiments of the present invention will now be described with reference to FIGS. 2-6, respectively.

FIG. 2 is an illustration of a semiconductor device including an NMOS device 152 and a PMOS device 154 both formed on substrate 100. The NMOS device 152 includes a first gate electrode 140a, a first gate dielectric 102A, and an n-type channel region 104. The first gate dielectric layer 102A is formed over the n-type channel region 104 of substrate 100. The first gate electrode 140a is formed over the gate dielectric 102A. The first gate electrode 140a is formed of a conductive material which may optionally be polysilicon. In this embodiment, the first gate dielectric 102A includes a layer of high-k material 120, such as hafnium oxide ($HfO_2$). In this embodiment, the first gate dielectric 102A may also include a first interface layer 110.

The PMOS device 154 includes a p-type channel region 106, a second gate dielectric 102B, and a second gate electrode 140. The second gate dielectric 102B is formed over the p-type channel region 106 of substrate 100. The second gate electrode 140b is formed over the second gate dielectric layer 102B. In this embodiment, the second gate dielectric 102B includes two high-k dielectric layers 120 and 130. For example, high-k dielectric layer 120 may be hafnium oxide ($HfO_2$) layer and high-k dielectric layer 130 may be aluminum oxide ($Al_2O_3$). Further, the second gate dielectric 102B may also include an interface layer 110. The second gate electrode 140b is formed of a conductive material which may optionally be polysilicon.

Figure 3:
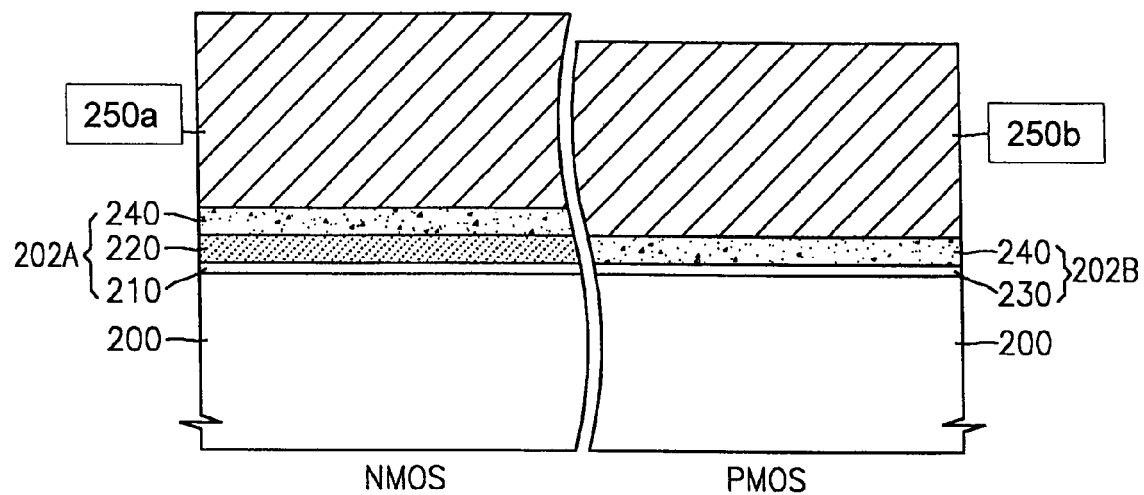
FIG. 3 is a schematic cross-sectional view of an MOS device according to another embodiment of the present invention.

FIG. 3 is an illustration of a semiconductor device including an NMOS device and a PMOS device both formed on substrate 200. In this embodiment, the NMOS device includes a first gate dielectric 202A and a first gate electrode 250a. Likewise, the PMOS device includes a second gate electrode 202B and a second gate electrode 250b. In this embodiment, the first gate dielectric 202A includes a hafnium oxide ($HfO_2$) layer 220 formed below an aluminum oxide ($Al_2O_3$) layer 240. The first gate dielectric 202A may further include a first interface layer 210. The second gate dielectric 202B of the PMOS device includes an aluminum oxide ($Al_2O_3$) layer 240. Further, the second gate dielectric 202B may include an interface layer 230. The first and second gate electrodes 250a and 250b are formed of a conductive material which may optionally be polysilicon.

Figure 4:
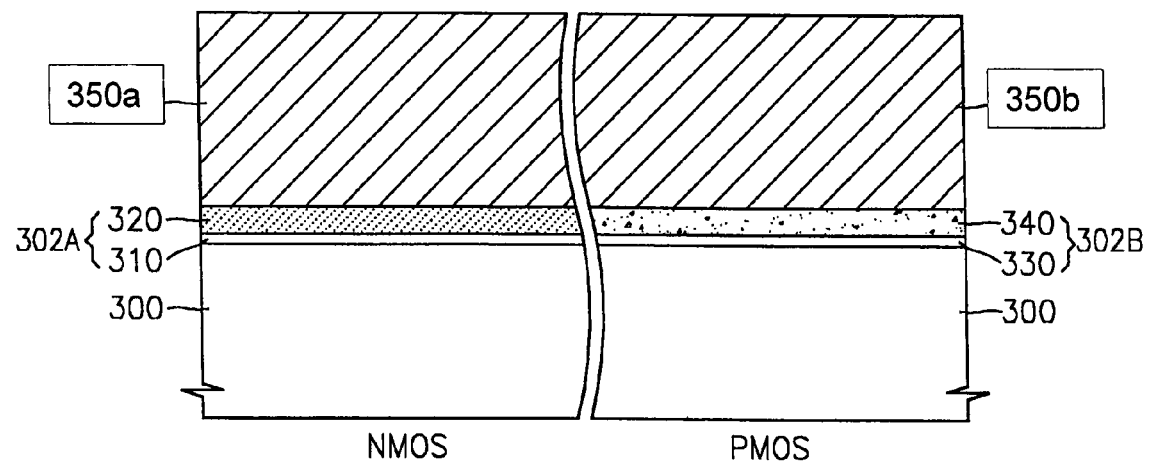
FIG. 4 is a schematic cross-sectional view of an MOS device according to yet another embodiment of the present invention.

FIG. 4 illustrates an embodiment of the present invention in which an NMOS device and a PMOS device are formed on substrate 300. In this embodiment, the NMOS device includes a first gate dielectric 302A and a gate electrode 350a. The PMOS device includes a second gate dielectric 302B and a gate electrode 350b. In this embodiment, the first gate dielectric 302A includes a hafnium oxide ($HfO_2$) layer 320 formed over the substrate 300. The first gate dielectric 302A may also include an interface layer 310. The second gate dielectric 302B of the PMOS device includes an aluminum oxide ($Al_2O_3$) layer 340 formed over the substrate 300. The second gate dielectric 302B may also include an interface layer 330. The first and second gate electrodes 350a and 350b are formed of a conductive material which may optionally be polysilicon.

Figure 5:
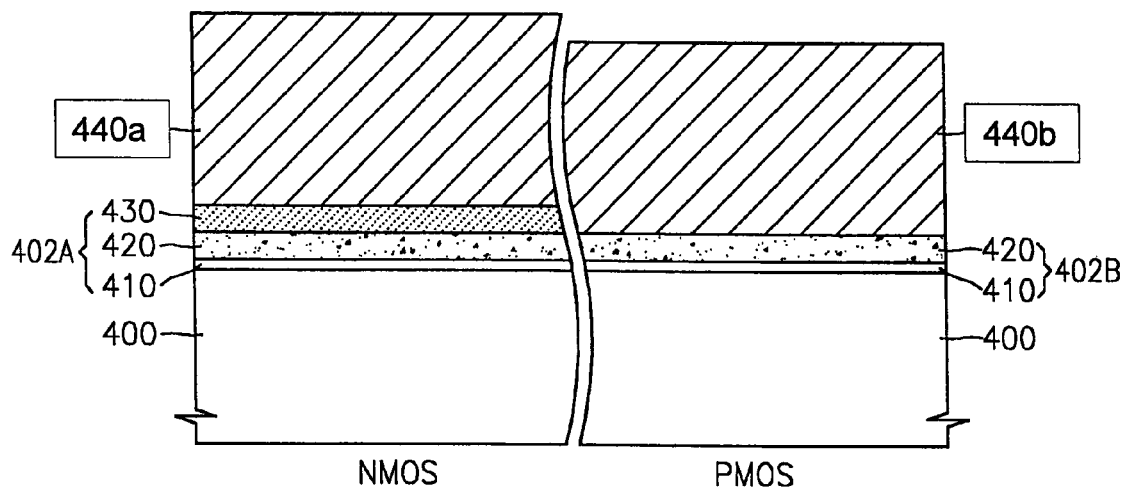
FIG. 5 is a schematic cross-sectional view of an MOS device according to still another embodiment of the present invention.

FIG. 5 illustrates an embodiment of the present invention in which an NMOS device and a PMOS device are formed on substrate 400. In this embodiment, the NMOS device includes a first gate dielectric 402A and a first gate electrode 440a. Likewise, the PMOS device includes a second gate dielectric 402B and a gate electrode 440b. The gate dielectric 402A includes a hafnium oxide layer 430 over an aluminum oxide ($Al_2O_3$) layer 420. The first gate dielectric 402A may also include an interface layer 410. The second gate dielectric 402B of the PMOS device includes an aluminum oxide ($Al_2O_3$) layer 420. The second gate dielectric 402B may also include an interface layer 410. The first and second gate electrodes 440a and 440b are formed of a conductive material which may optionally be polysilicon.

Figure 6:
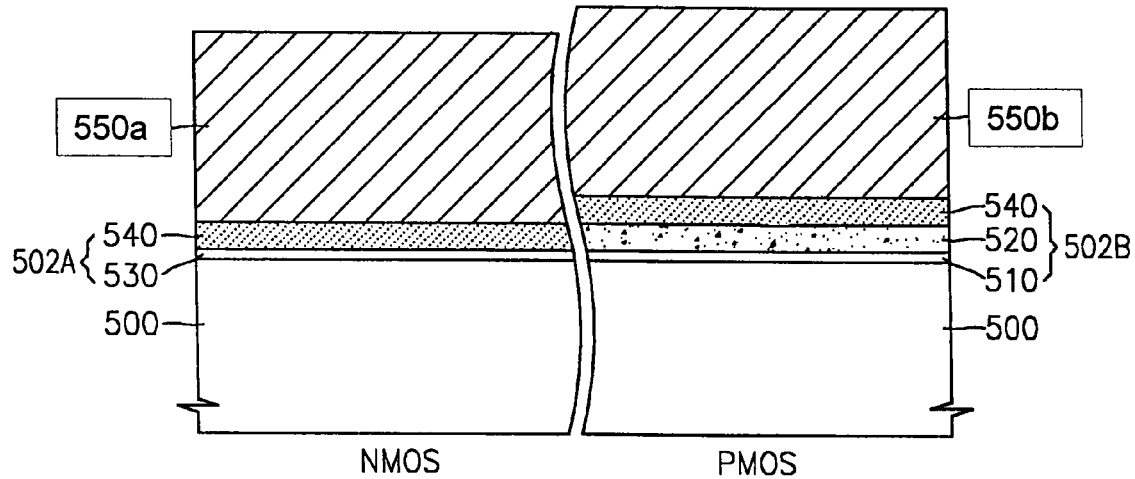
FIG. 6 is a schematic cross-sectional view of an MOS device according to another embodiment of the present invention.

FIG. 6 illustrates an embodiment of the present invention in which an NMOS device and a PMOS device are formed on substrate 500. In this embodiment, the NMOS device includes a first gate dielectric 502A and a first gate electrode 550a. The PMOS device includes a second gate dielectric 502B and a second gate electrode 550b formed over the substrate 500. The first gate dielectric 502A includes a hafnium oxide ($HfO_2$) layer 540. The first gate dielectric 502A may also include an interface layer 530. The second gate dielectric 502B includes a hafnium oxide ($HfO_2$) layer 540 over an aluminum oxide ($Al_2O_3$) layer 520. The second gate dielectric 502B may also include an interface layer 510. The first and second gate electrodes 550a and 550b are formed of a conductive material which may optionally be polysilicon.

As alternative to polysilicon, or in addition to polysilicon, the gate electrodes of the above-described embodiments may be formed of a metal and/or a metal nitride.

A method of manufacturing the MOS device of FIG. 2 according to an embodiment of the present invention will now be described with reference to FIGS. 7(A) through 7(F).

Figure 7A:
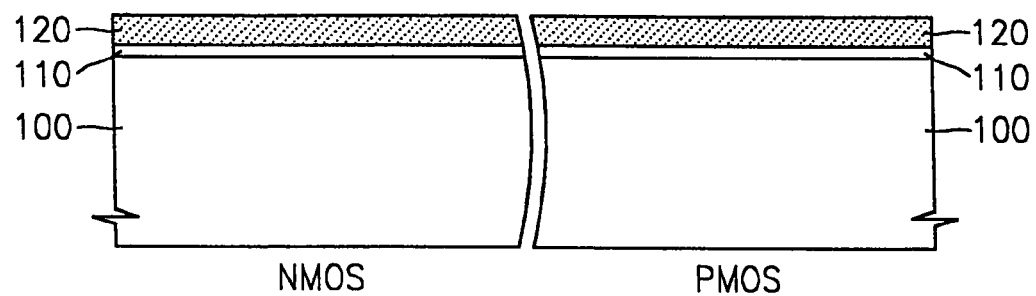
FIGS. 7(A) through 7(H) are schematic cross-sectional views for explaining a method of manufacturing the MOS device of FIG. 2 according to an embodiment of the present invention.

Referring first to FIG. 7(A) an interface layer 110 and a hafnium oxide ($HfO_2$) layer 120 are formed in turn over an NMOS region and a PMOS region of a semiconductor substrate 100. The interface layer 110 serves as an interface between the hafnium oxide ($HfO_2$) layer 120 and the substrate 100. The interface layer 110 may be formed of a low-k material, which has a dielectric constant k less than 8. As examples, silicon oxide (k equals about 4), silicon oxynitride (k equals about 4~8 according to oxygen content), silicate, or a combination thereof, may be used as the interface layer 110. In addition, the interface layer 110 may also be formed with a treatment of ozone gas or ozone water. The $HfO_2$ layer 120 is formed on the interface layer 110, and may have a thickness less than about 50 Å. In this exemplary embodiment, the thickness of the $HfO_2$ layer 120 is about 0.2~50 Å.

The $HfO_2$ layer 120 may be formed by a CVD (chemical vapor deposition) process or an ALD (atomic layer deposition) process. The CVD process may be performed with a hafnium source material (e.g., $HfCl_4$, $Hf(OtBu)_4$, $Hf(NEtMe)_4$, $Hf(NEt2)_4$, $Hf(NMe_2)_4$) and an oxygen source material (e.g., $O_2$, $O_3$, an oxygen radical) at about 400~600° C. and at a pressure of about 1~5 Torr. The ALD process may be performed with a hafnium source material (e.g., metal organic precursor, $HfCl_4$, $Hf(OtBu)_4$, $Hf(NEtMe)_4$, $Hf(MMP)_4$, $Hf(NEt_2)_4$, $Hf(NMe_2)_4$) and an oxygen source material (e.g., $H_2O$, $H_2O_2$, alcohol including an —OH radical, $O_2$ or $O_3$ plasma, O radical, $D_2O$) at about 150~500° C. and at about 0.1~5 Torr. The deposition process and a purging process may be repeated until an adequate thickness is formed. An ALD method is a low temperature process, having good step coverage and easy thickness control. However, one of ordinary skill in the art may appreciate variations from use of a CVD process or an ALD process without departing from the scope of the embodiments of the present invention.

Figure 7B:
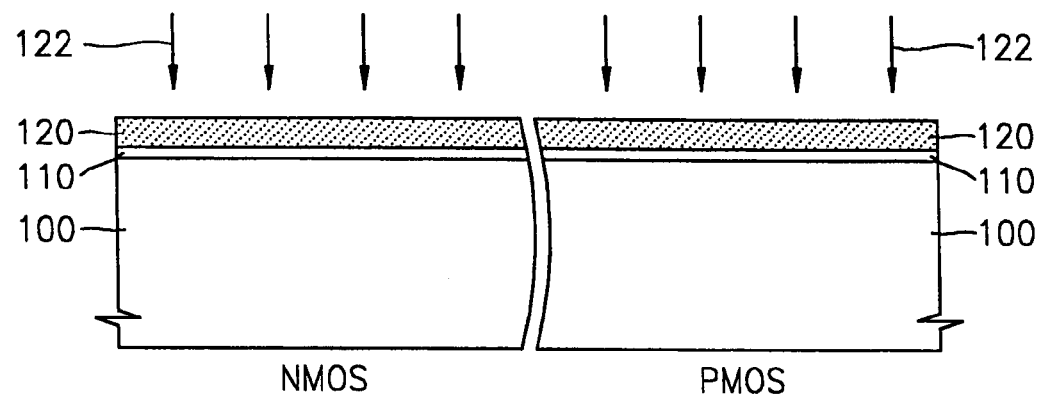

Next, as illustrated in FIG. 7(B), the $HfO_2$ layer 120 is densified by annealing in atmospheric gas 122 (e.g. $N_2$, $N_O$, $N2_O$, $NH_3$, $O_2$ or mixture thereof). The surrounding gas 122 may include nitrogen for nitriding of the $HfO_2$ layer 120. The annealing may be performed in a vacuum at about 750~1050° C. The annealing decreases the etch rate of the wet cleaning solution (e.g. a cleaning solution including fluorine). If the annealing is performed under 750° C., the etch rate may not be sufficiently reduced and if the annealing is performed at a very high temperature, crystallization of the $HfO_2$ layer 120 may occur, resulting in an increase in leakage current.

Figure 7C:
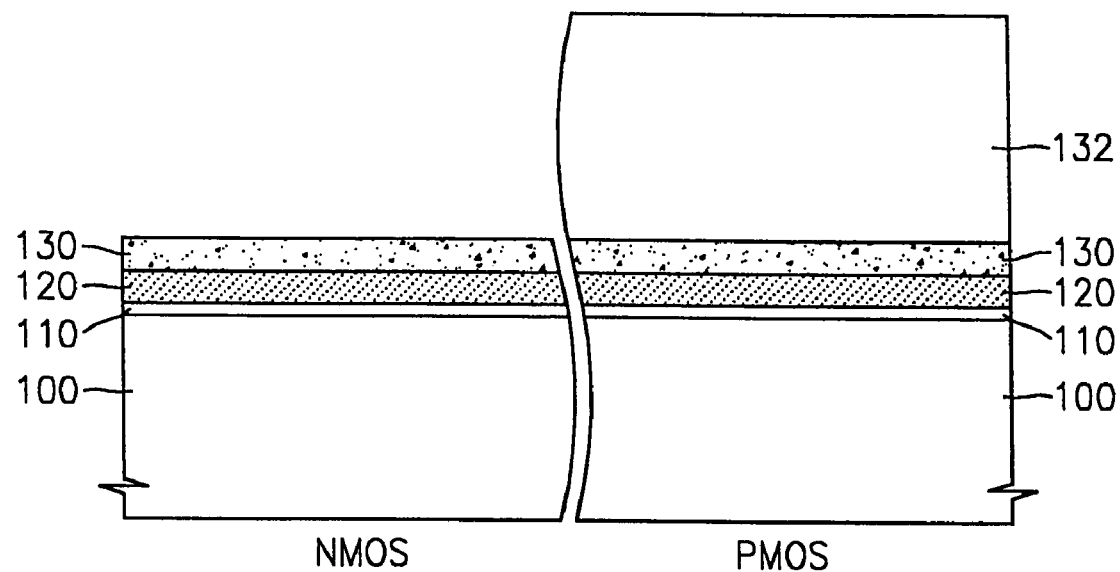

Next, as illustrated in FIG. 7(C), an $Al_2O_3$ layer 130 is formed on the $HfO_2$ layer 120. The $Al_2O_3$ layer 130 may have a thickness of less than about 50 Å. In this embodiment, the thickness of the $Al_2O_3$ layer 130 is in the range of about 0.2~50 Å. The $Al_2O_3$ 130 may be formed by a CVD (chemical vapor deposition) process or ALD (atomic layer deposition) process. If ALD is used, the deposition process may be performed with an aluminum source material (e.g., trimethyl aluminum, $AlCl_3$, $AlH_3N(CH_3)_3$, $C_6H_{15}AlO$, $(C_4H_9)_2AlH$, $(CH_3)_2AlCl$, $(C_2H_5)_3Al$, $(C_4H_9)_3Al$) and oxygen source material (e.g., $H_2O$, $H_2O_2$, O radical, $D_2O$, $N_2O$ plasma, $O_2$ plasma) at about 200~500° C. and at about 0.1~5 Torr. The deposition process and a purging process may be repeated until the desired thickness is formed. If $O_3$ is used as the oxygen source material, a subsequent annealing step may be omitted and the thermal budget can thus be minimized.

Then, a photo resist pattern 132 is formed on both the NMOS region and the PMOS region, and then removed from over the NMOS region.

Figure 7D:
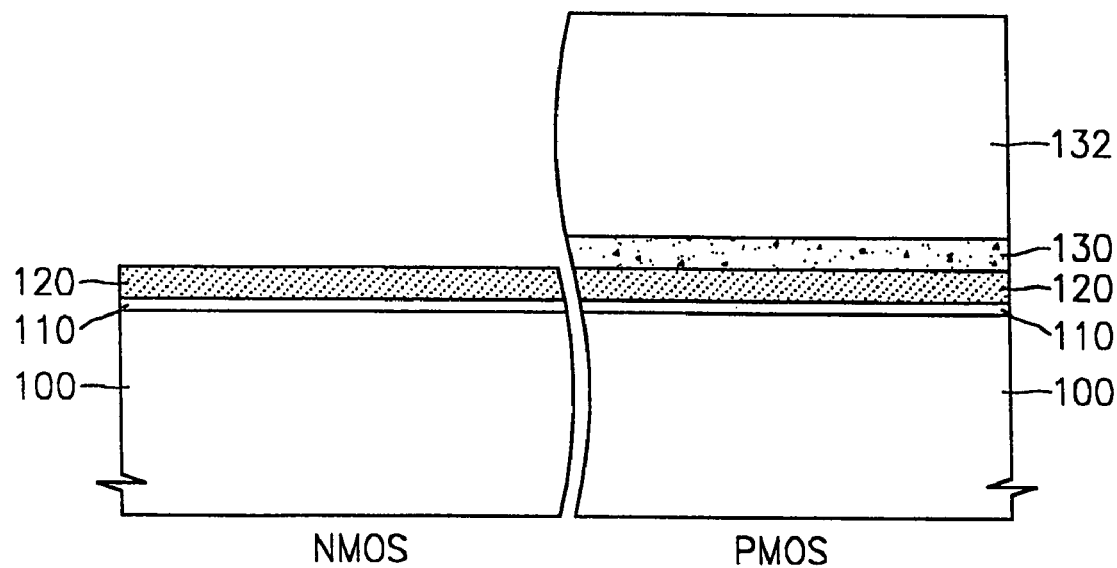

Referring to FIG. 7(D), the $Al_2O_3$ layer 130 on the NMOS region is removed with a cleaning solution using the photoresist 132 as a mask. The cleaning solution may contain fluorine (e.g. a HF solution or 200:1 dilute HF solution).

Figure 7E:
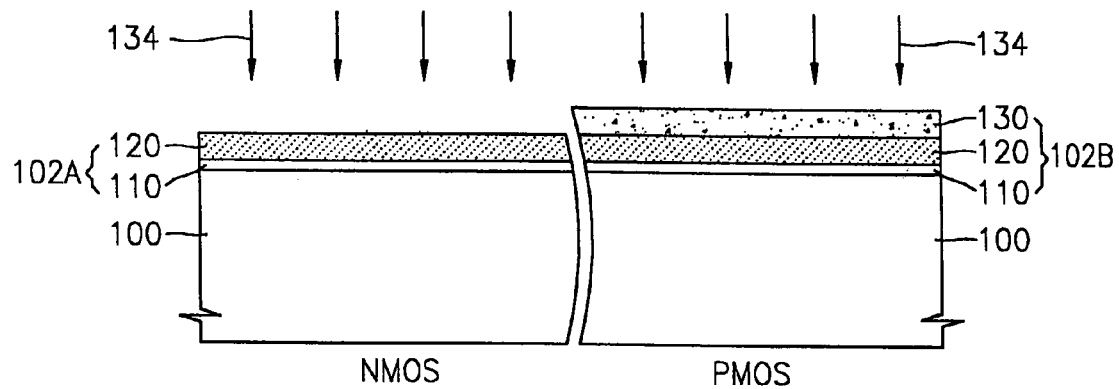

Next, as illustrated in FIG. 7(E), the photo resist layer 132 is removed (e.g. by ashing and striping processes), and the surfaces of the $HfO_2$ layer 120 and $Al_2O_3$ layer 130 are annealed in a surrounding gas 134. In this and the other embodiments, the anneal gas 134 is preferably $N_2$, NO, $N_2O$, $NH_3$, $O_2$ or combinations thereof. It should be noted that annealing in a nitrogen atmosphere can result in the anneal layer or layers containing nitrogen after the anneal. As one example only, an $HfO_2$ layer can become an HfON layer. The annealing is preferably performed at about 750~1050° C. If the annealing is performed under 750° C., the etch rate may not be sufficiently reduced. If the annealing is performed at a very high temperature, leakage current can increase.

The annealing densifies the $Al_2O_3$ layer 130 on the PMOS region to increase impurity penetration. In addition, the annealing helps avoid abrupt structural changes at the interface between the $HfO_2$ layer 120 and the $Al_2O_3$ 130. As one of ordinary skill in the art will appreciate, the materials at the interface between the HfO2 and Al2O3 layers will react upon deposition to form one or more chemically mixed intermediate layers or regions. Annealing creates an alloy oxide layer between the $HfO_2$ layer 120 and the $Al_2O_3$ layer 130. Annealing can also form an alloy oxide at the interface with the underlying interface layer 110.

The annealing methods of the embodiments herein are not limited to those described above. Other methods may be adopted instead, such as plasma treatment in a nitrogen atmosphere and then heat treatment in a vacuum or oxygen atmosphere.

Figure 7F:
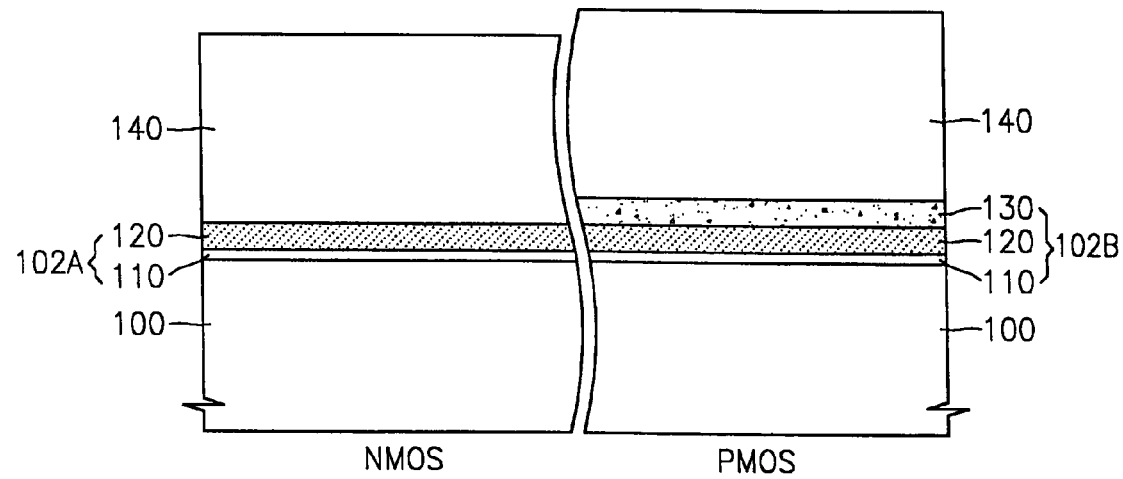

Referring next to FIG. 7(F), a poly silicon layer 140 is formed over the NMOS and PMOS regions.

Figure 7G:
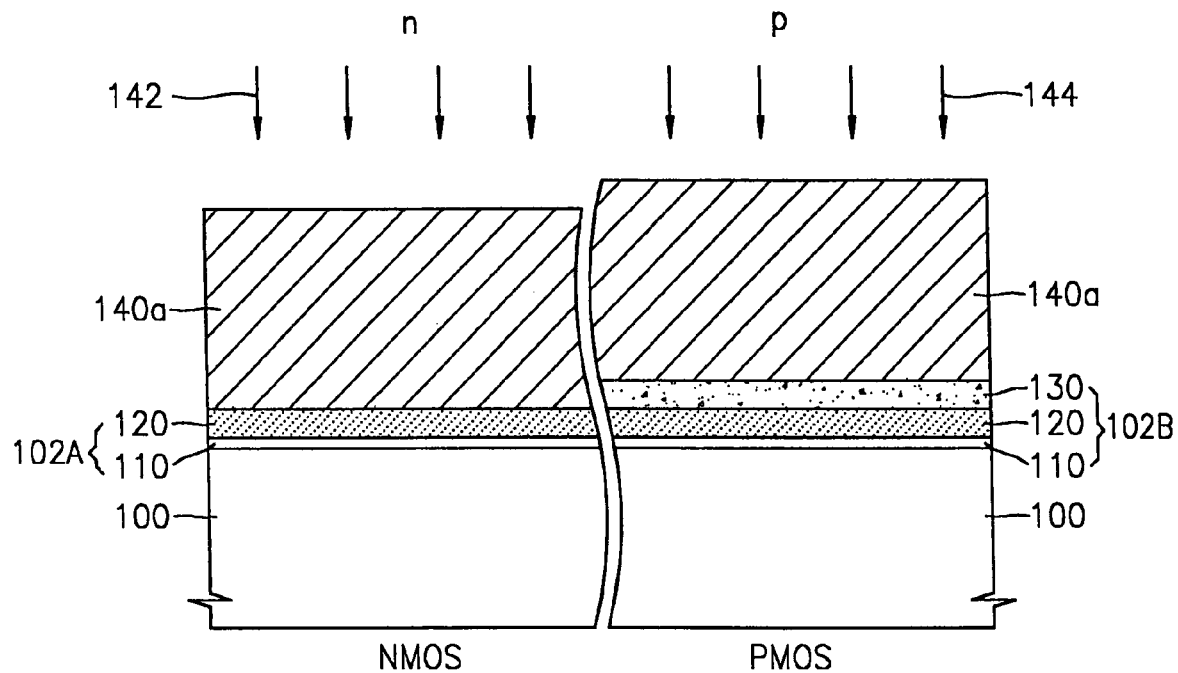

Then, referring to FIG. 7(G), impurities 142 (e.g., P or As) and impurities 144 (e.g., B) are implanted in the polysilicon layer 140 to form conductive polysilicon layers 140a and 140b.

Figure 7H:
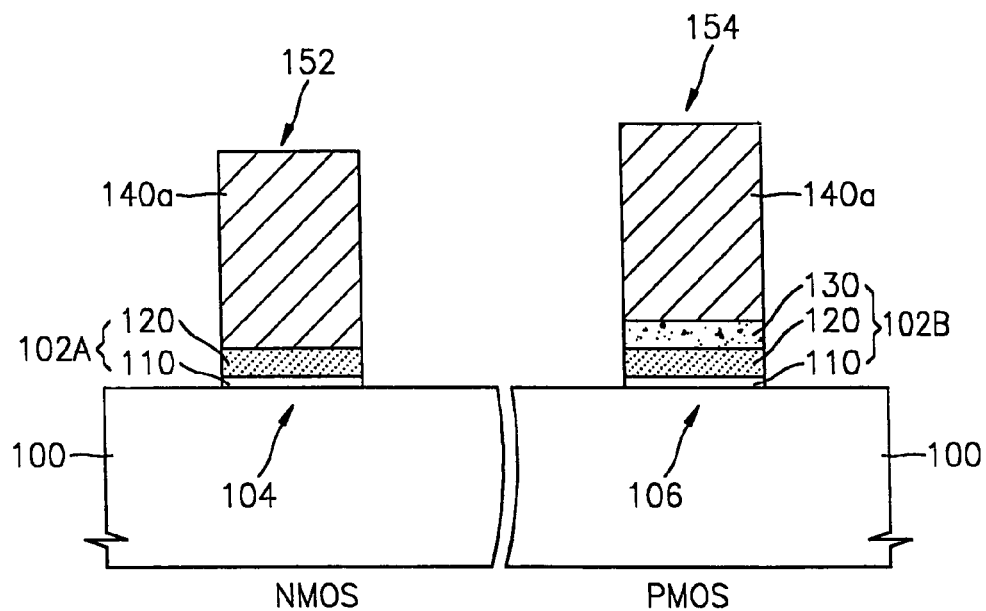

Then, as illustrated in example FIG. 7(H), the conductive polysilicon layers 140a and 140b are patterned to form gate patterns for the NMOS transistor 152 and PMOS transistor 154 are then formed. Source and drain regions are formed, forming the NMOS transistor and the PMOS transistor.

A method of manufacturing the MOS device of FIG. 3 according to an embodiment of the present invention will now be described with reference to FIGS. 8(A) through 8(E).

Figure 8A:
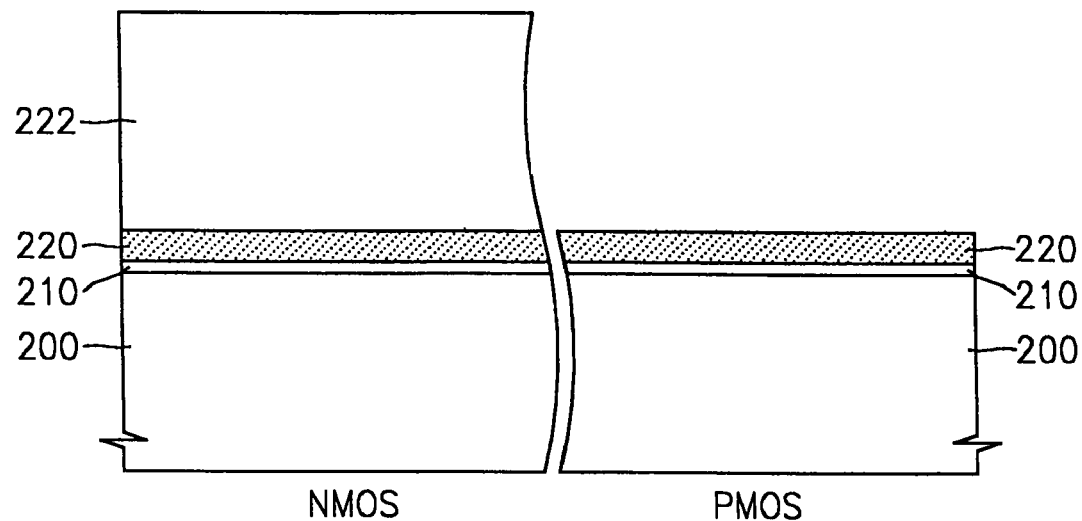
FIGS. 8(A) through 8(E) are schematic cross-sectional views for explaining a method of manufacturing the MOS device of FIG. 3 according to an embodiment of the present invention.

As illustrated in FIG. 8(A), an interface layer 210 is formed over the NMOS region and PMOS region of semiconductor substrate 200. An $HfO_2$ layer 220 is formed on the interface layer 210, and a photo resist pattern 222 is formed on the NMOS region.

Figure 8B:
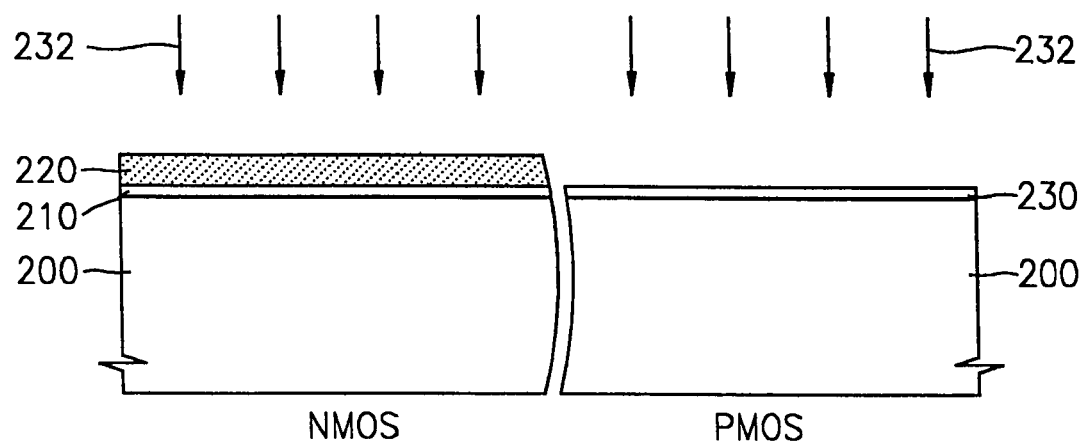

Referring to example FIG. 8(B), the $HfO_2$ layer 220 is selectively removed from over the PMOS region (e.g. by dry or wet etching). When the $HfO_2$ layer 220 on the PMOS region is removed, the interface layer 210 on PMOS region may be removed as well. In this case, second interface layer 230 may then be formed on the substrate 200 on the PMOS region. The surface of the $HfO_2$ layer 220 may be annealed in atmospheric gas 232.

Figure 8C:
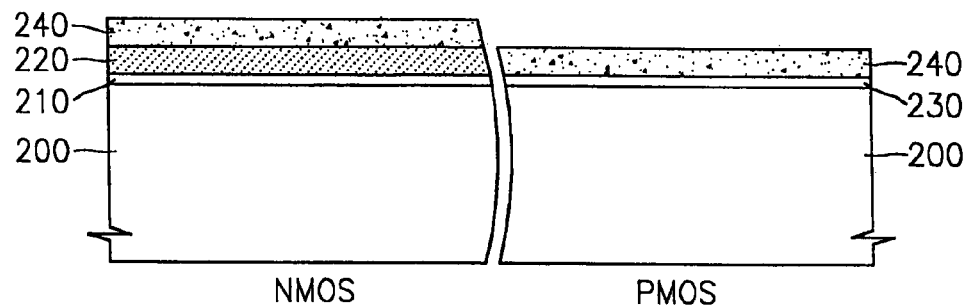

Referring to FIG. 8(C), $Al_2O_3$ layer 240 is formed on the $HfO_2$ layer 220 and the second interface layer 230.

Figure 8D:
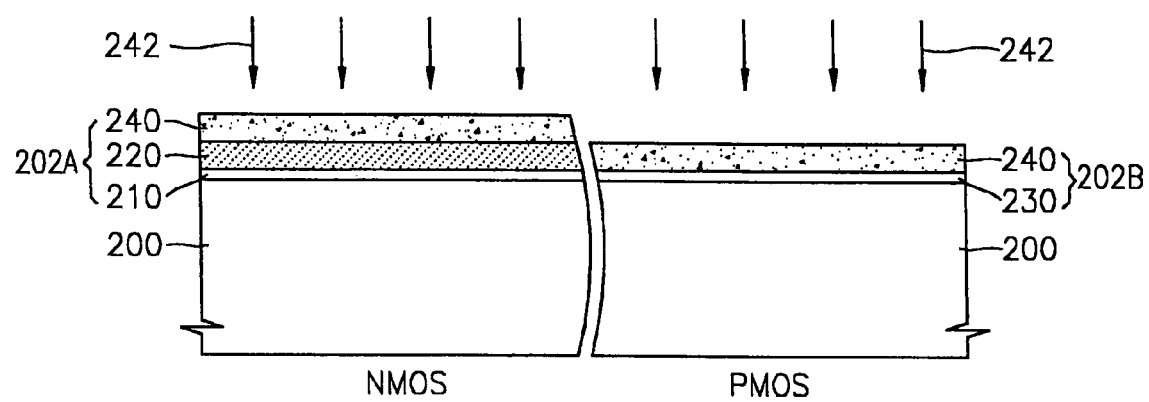

Referring to FIG. 8(D), the surface of the $Al_2O_3$ layer 240 is then annealed with annealing gas 242.

Figure 8E:
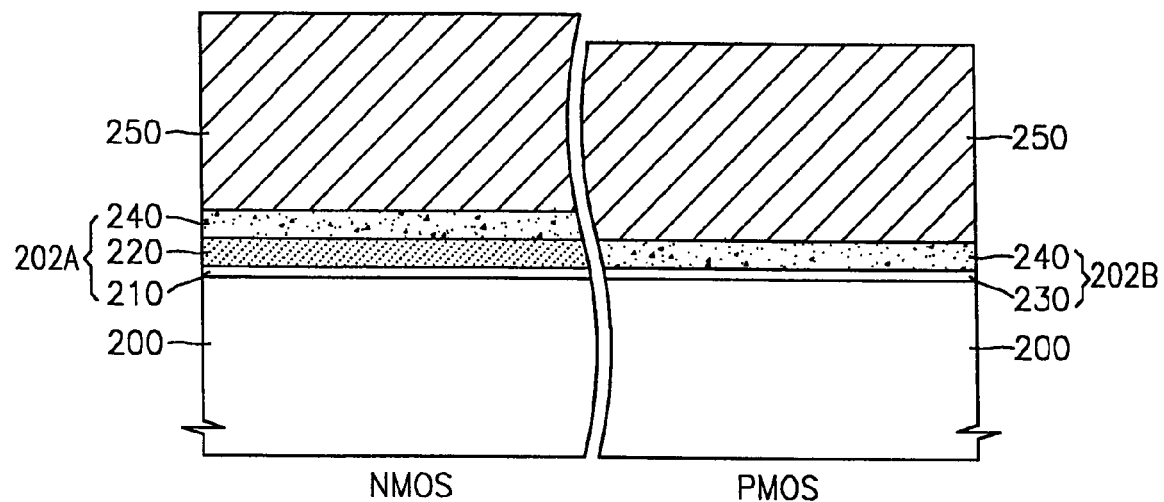

Then, referring to FIG. 8(E), conductive layer 250 is formed on the first gate dielectric layer 202A on the NMOS device and on the second dielectric layer 202B on the PMOS device. The conductive layer 250 is used to form gate electrodes as described previously.

A method of manufacturing the MOS device of FIG. 4 according to an embodiment of the present invention will now be described with reference to FIGS. 9(A) through 9(C).

Figure 9A:
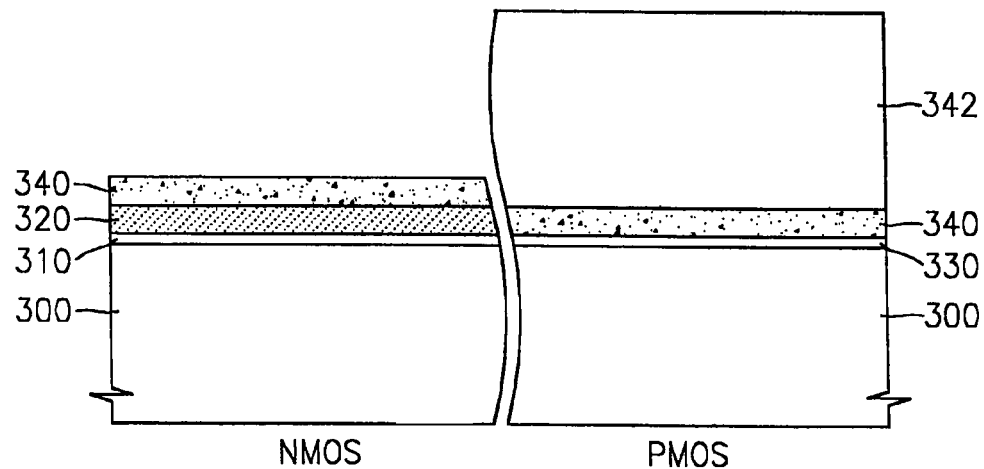
FIGS. 9(A) through 9(C) are schematic cross-sectional views for explaining a method of manufacturing the MOS device of FIG. 4 according to an embodiment of the present invention.

Referring to FIG. 9(A), a structure is obtained in the same manner as described above in connection with FIG. 8(D). As shown, the structure includes a first interface layer 310 formed on the NMOS region of a semiconductor substrate 300, and a second interface layer 330 formed on the PMOS region of a semiconductor substrate 300. The structure also includes an $HfO_2$ layer 320 is formed on the interface layer 310, and an $Al_2O_3$ layer 340 is formed on the NMOS region and the PMOS region as shown. Then, as shown in FIG. 9(A), photo resist pattern 342 is formed only on the PMOS region.

Figure 9B:
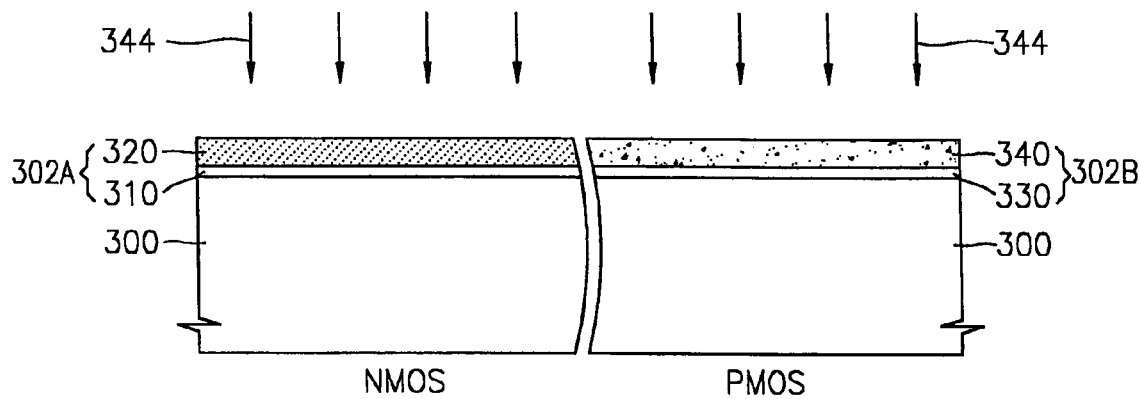

Next, referring to FIG. 9(B), the $Al_2O_3$ layer 340 on the NMOS region is removed, and the remaining $Al_2O_3$ layer 340 and the $HfO_2$ layer 320 are annealed in atmospheric gas 344.

Figure 9C:
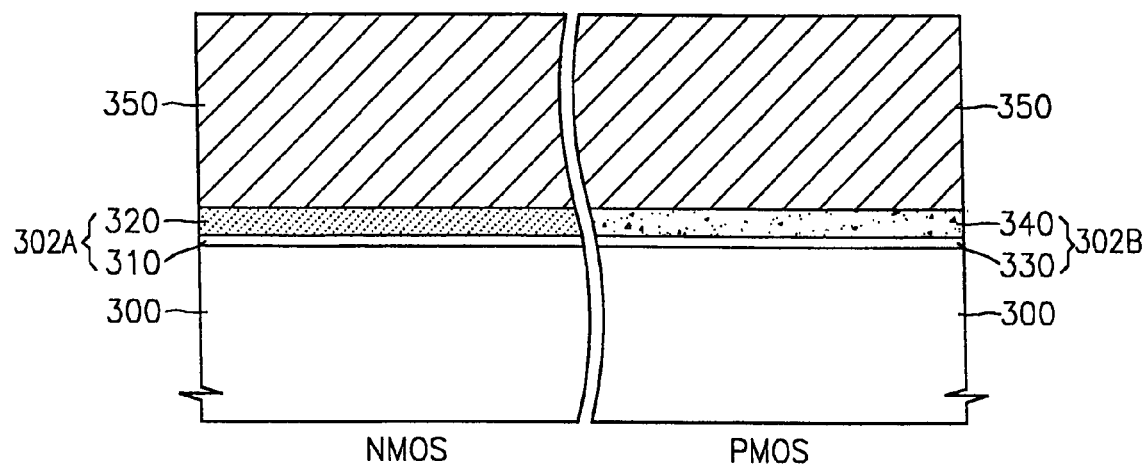

Then, referring to FIG. 9(C), conductive layer 350 is formed on the NMOS region and the PMOS region. The conductive layer 350 is used to form gate electrodes as described previously.

A method of manufacturing the MOS device of FIG. 5 according to an embodiment of the present invention will now be described with reference to FIGS. 10(A) through 10(F). The process of this embodiment is analogous to the process of FIGS. 7(A) through 7(H), except that the $Al_2O_3$ layer is formed prior to the $HfO_2$ layer. Accordingly, the explanation that follows is abbreviated to avoid redundancy.

Figure 10A:
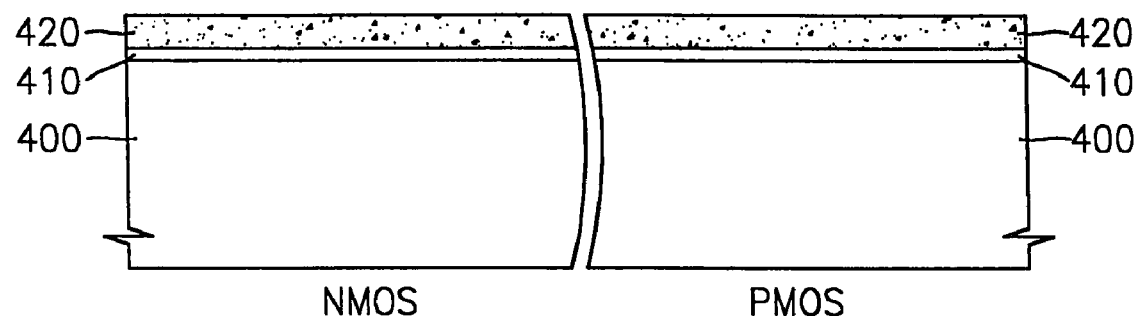
FIGS. 10(A) through 10(F) are schematic cross-sectional views for explaining a method of manufacturing the MOS device of FIG. 5 according to an embodiment of the present invention.

Referring first to FIG. 10(A) an interface layer 410 and an aluminum oxide $Al_2O_3$ layer 420 are formed in turn over an NMOS region and a PMOS region of a semiconductor substrate 400.

Figure 10B:
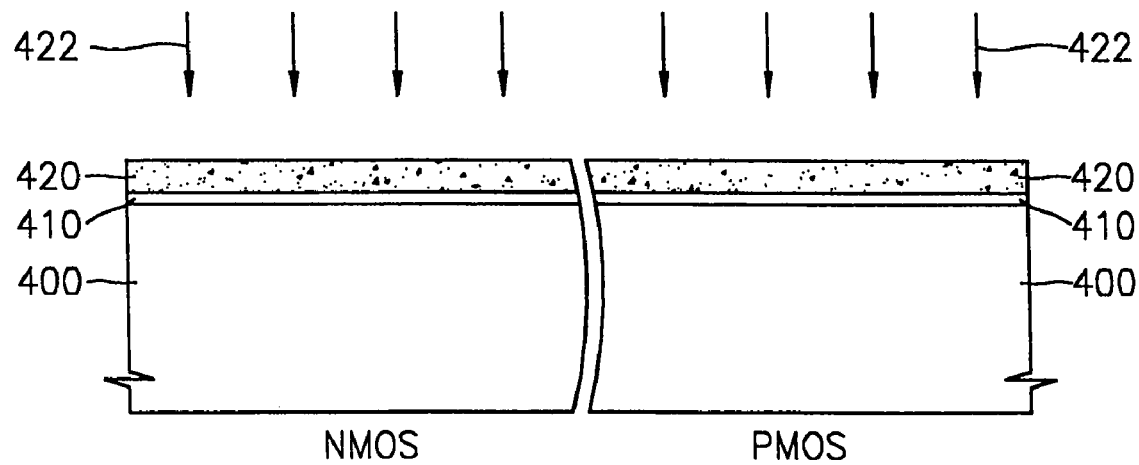

Next, as illustrated in FIG. 10(B), the $Al_2O_3$ layer 420 is annealed in atmospheric gas 422.

Figure 10C:
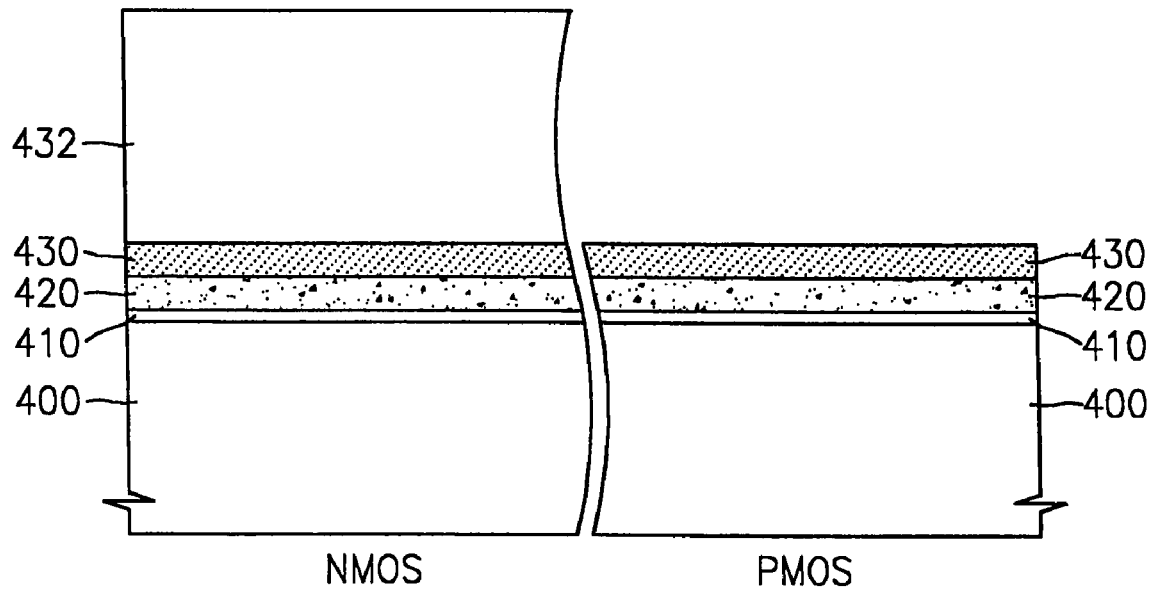

Next, as illustrated in FIG. 10(C), an HfO$_2$ layer 430 is formed on the Al$_2$O$_3$ layer 420. Further, a photo resist pattern 432 is formed over the NMOS region.

Figure 10D:
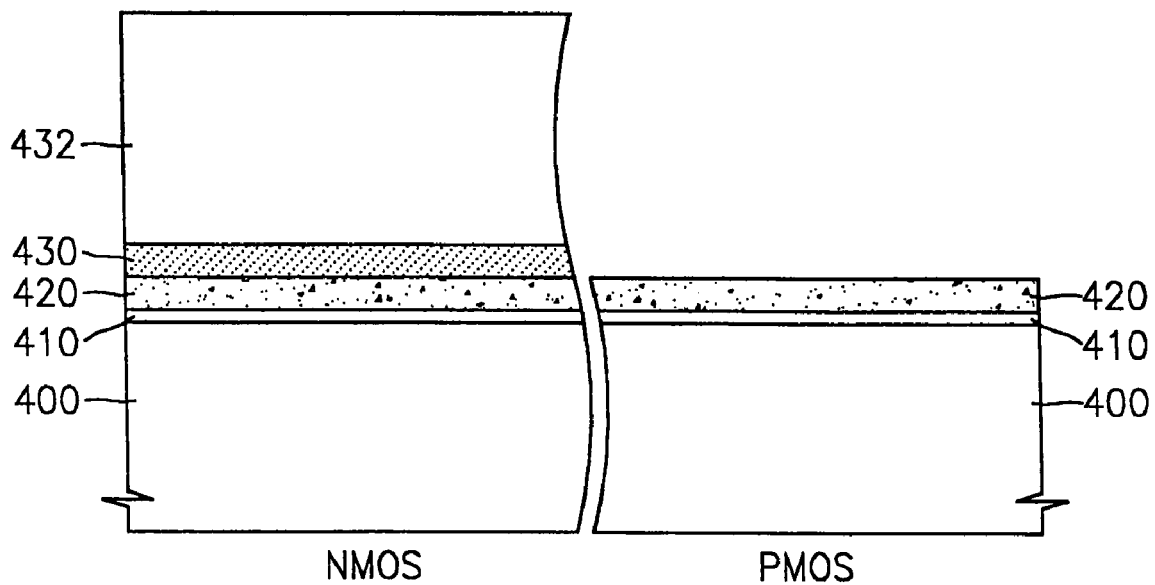

Referring to FIG. 10(D), the HfO$_2$ layer 430 on the PMOS region is removed with a cleaning solution using the photoresist 432 as a mask.

Figure 10E:
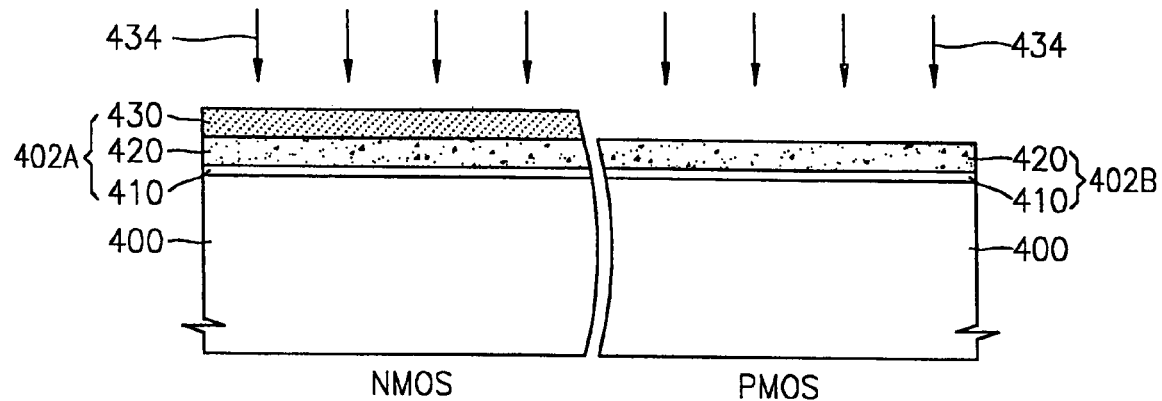

Next, as illustrated in FIG. 10(E), the photo resist layer 432 is removed, and the surfaces of the HfO$_2$ layer 430 and Al$_2$O$_3$ layer 420 are annealed in a surrounding gas 434.

Figure 10F:
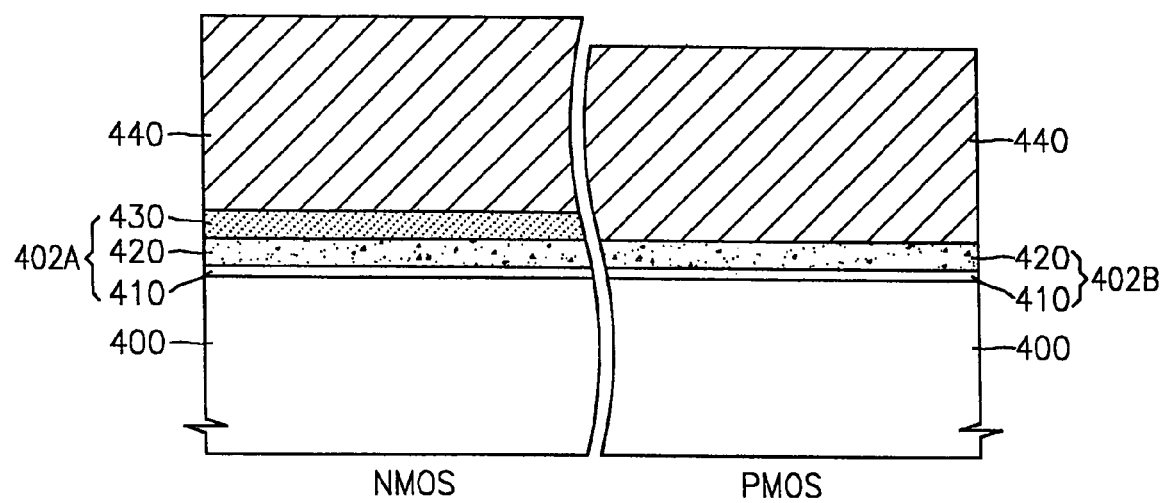

Referring next to FIG. 10(F), a polysilicon layer 440 is formed over the NMOS and PMOS regions. The polysilicon layer 440 is used to form gate electrodes as described previously.

A method of manufacturing the MOS device of FIG. 6 according to an embodiment of the present invention will now be described with reference to FIGS. 11(A) through 11(E). The process of this embodiment is analogous to the process of FIGS. 8(A) through 8(E), except that the Al$_2$O$_3$ layer is formed prior to the HfO$_2$ layer. Accordingly, the explanation that follows is abbreviated to avoid redundancy.

Figure 11A:
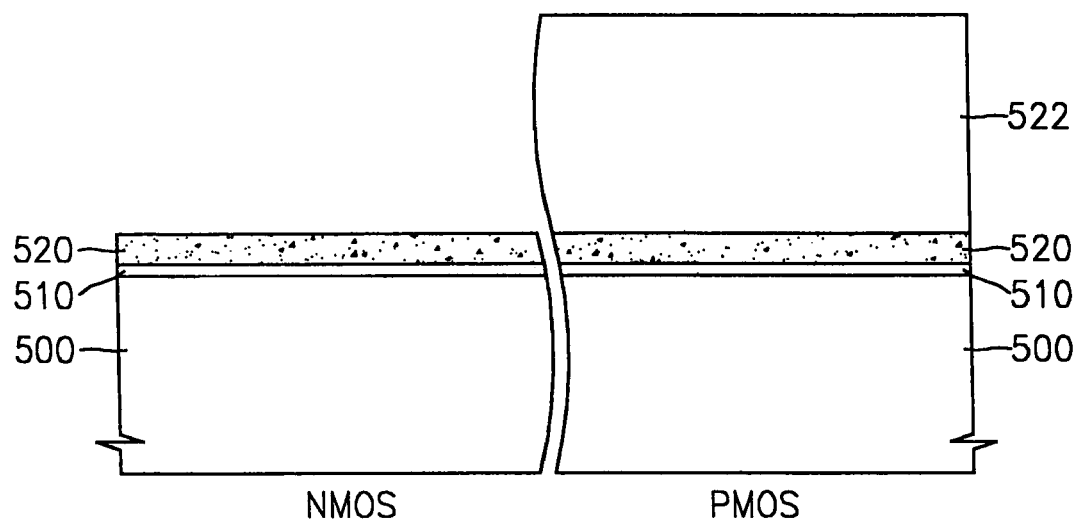
FIGS. 11(A) through 11(E) are schematic cross-sectional views for explaining a method of manufacturing the MOS device of FIG. 6 according to an embodiment of the present invention.

As illustrated in FIG. 11(A), an interface layer 510 is formed over the NMOS region and PMOS region of semiconductor substrate 500. An Al$_2$O$_3$ layer 520 is formed on the interface layer 510, and a photo resist pattern 522 is formed on the PMOS region.

Figure 11B:
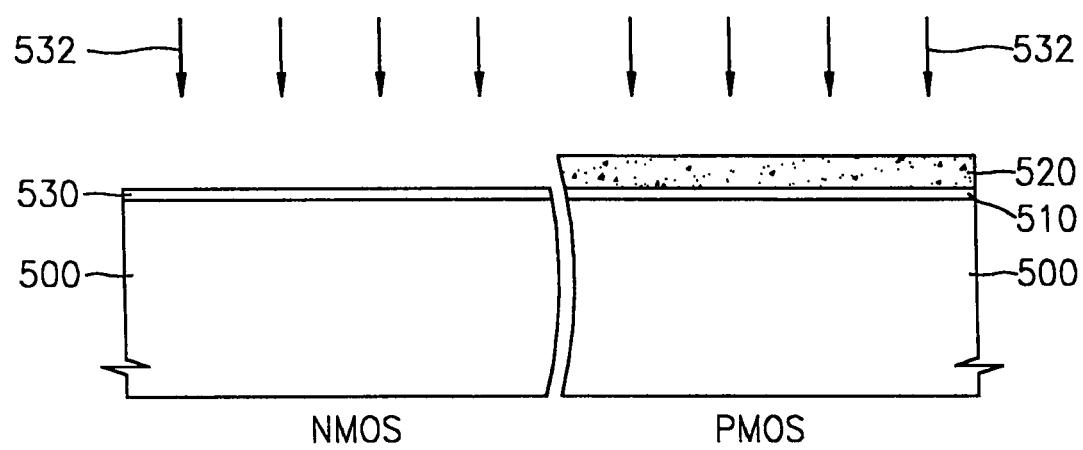

Referring to example FIG. 11(B), the Al$_2$O$_3$ layer 520 is selectively removed from over the NMOS region. When the Al$_2$O$_3$ layer 220 on the NMOS region is removed, the interface layer 510 on NMOS region may be removed as well. In this case, second interface layer 530 may then be formed on the substrate 500 on the NMOS region. The surface of the Al$_2$O$_3$ layer 220 may then be annealed in atmospheric gas 532.

Figure 11C:
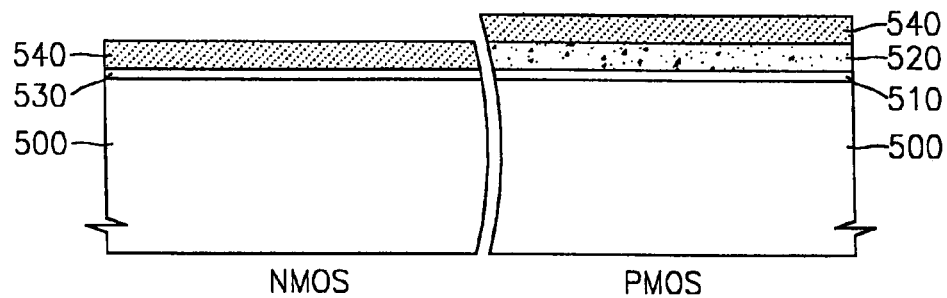

Referring to FIG. 11(C), HfO$_2$ layer 540 is formed on the Al$_2$O$_3$ layer 520 and the second interface layer 530.

Figure 11D:
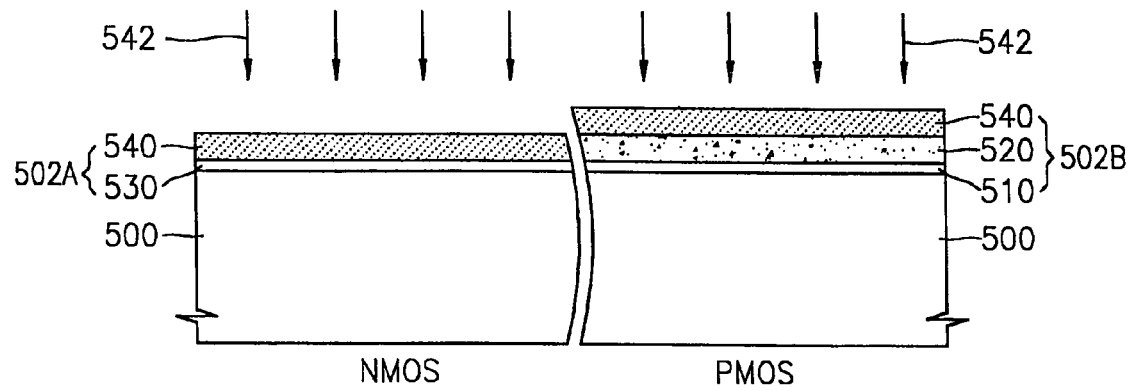

Referring to FIG. 11(D), the surface of the HfO$_2$ layer 540 is then annealed with annealing gas 542.

Figure 11E:
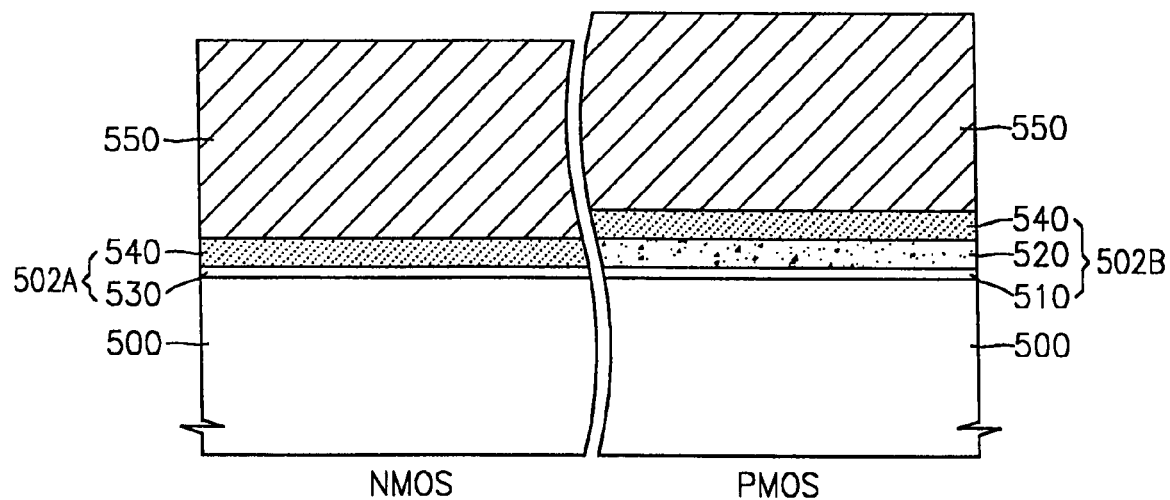

Then, referring to FIG. 11(E), conductive layer 550 is formed on the first gate dielectric layer 502A on the NMOS device and on the second dielectric layer 502B on the PMOS device. The conductive layer 550 is used to form gate electrodes as described previously.

Another method of manufacturing the MOS device of FIG. 4 according to an embodiment of the present invention will now be described with reference to FIGS. 12(A) through 12(C). The process of this embodiment is analogous to the process of FIGS. 9(A) through 9(C), except that the Al$_2$O$_3$ layer is formed prior to the HfO$_2$ layer. Accordingly, the explanation that follows is abbreviated to avoid redundancy.

Figure 12A:
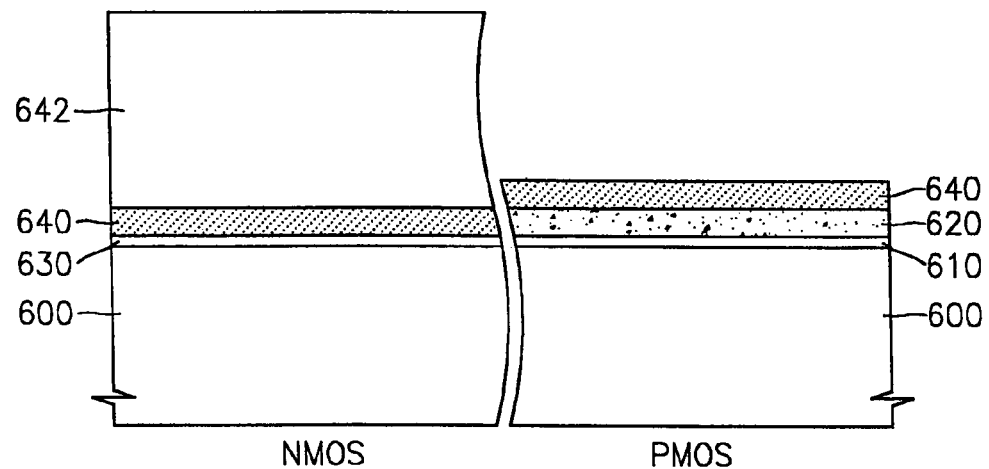
FIGS. 12(A) through 12(C) are schematic cross-sectional views for explaining another method of manufacturing the MOS device of FIG. 4 according to an embodiment of the present invention.

Referring to FIG. 12(A), a structure is obtained in the same manner as described above in connection with FIG. 11(D). As shown, the structure includes a first interface layer 610 formed on the PMOS region of a semiconductor substrate 600, and a second interface layer 630 formed on the NMOS region of a semiconductor substrate 600. The structure also includes an Al$_2$O$_3$ layer 620 formed on the interface layer 610, and an HfO$_2$ layer 640 formed on the NMOS region and the PMOS region as shown. Then, as shown in FIG. 11(A), photo resist pattern 642 is formed only on the NMOS region.

Figure 12B:
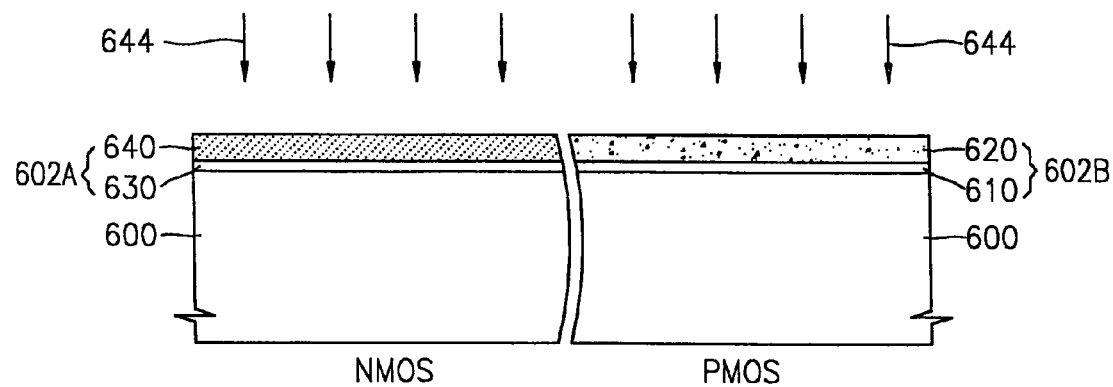

Next, referring to FIG. 12(B), the HfO$_2$ layer 640 on the PMOS region is removed, and the remaining HfO$_2$ layer 640 and the Al$_2$O$_3$ layer 620 are annealed in atmospheric gas 644.

Figure 12C:
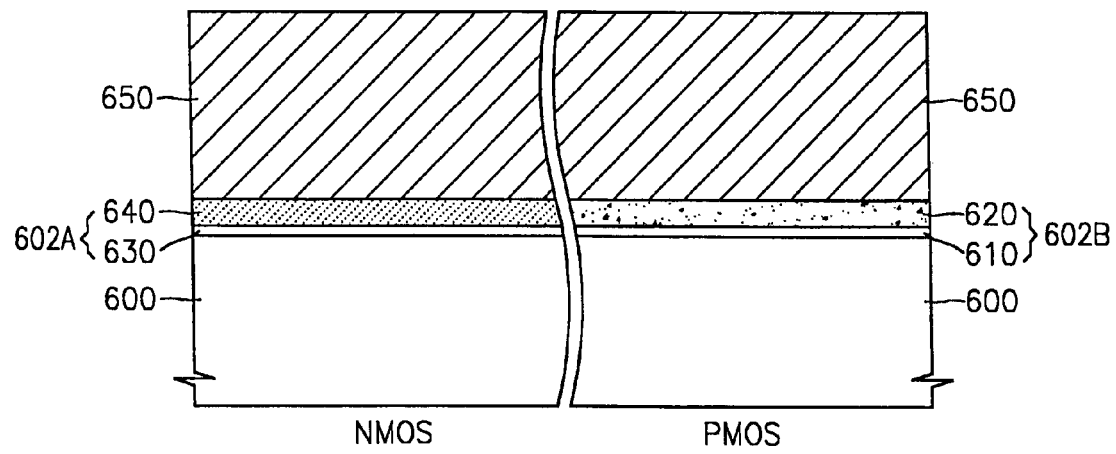

Then, referring to FIG. 12(C), conductive layer 650 is formed on the NMOS region and the PMOS region. The conductive layer 650 is used to form gate electrodes as described previously.

The above discussed example embodiments are for the purpose of example only and should not be construed to limit the scope of the appended claims. The illustrated example embodiments are disclosed for the purpose of disclosing the invention so that one of ordinary skill in the art will be enabled to practice the invention. However, one of ordinary skill in the art would also appreciate other modifications without departing from the spirit and scope of the embodiments of the present invention.

What is claimed is:

1. A semiconductor device comprising:
   a first transistor comprising a first substrate region, a first gate electrode, and a first gate dielectric located between the first substrate region and the first gate electrode; and
   a second transistor comprising a second substrate region, a second gate electrode, and a second gate dielectric located between the second substrate region and the second gate electrode;
   wherein the first gate dielectric comprises a first high-k layer having a dielectric constant of 8 or more, wherein the second gate dielectric comprises a second high-k layer having a dielectric constant of 8 or more, and wherein the second high-k layer has a different material composition than the first high-k layer,
   wherein the first transistor is an NMOS device and the second transistor is a PMOS device,
   wherein the first gate dielectric comprises a third high-k layer having a dielectric constant of 8 or more,
   wherein the first high-k layer is a hafnium oxide layer, and wherein the second and third high-k layers are aluminum oxide layers, and
   wherein the second and third high-k layers are coplanar.

2. The semiconductor device as claimed in claim 1, wherein the first gate dielectric further comprises a first interface layer located between the first substrate region and the first high-k layer.

3. The semiconductor device as claimed in claim 2, wherein the first interface layer comprises a material selected from the group consisting of silicon oxide, silicon oxynitride, and silicate.

4. The semiconductor device as claimed in claim 1, wherein the second gate dielectric further comprises a second interface layer located between the second substrate region and the second high-k layer.

5. The semiconductor device as claimed in claim 4, wherein the second interface layer comprises a material selected from the group consisting of silicon oxide, silicon oxynitride and silicate.

6. The semiconductor device as claimed in claim 1, wherein the third high-k layer is located between the first substrate region and the first high-k layer.

7. A semiconductor device comprising:
   a first transistor comprising a first substrate region, a first gate electrode, and a first gate dielectric located between the first substrate region and the first gate electrode; and
   a second transistor comprising a second substrate region, a second gate electrode, and a second gate dielectric located between the second substrate region and the second gate electrode;
   wherein the first gate dielectric comprises a first high-k layer having a dielectric constant of 8 or more, wherein the second gate dielectric comprises a second high-k layer having a dielectric constant of 8 or more, and wherein the second high-k layer has a different material composition than the first high-k layer,
   wherein the first transistor is an NMOS device and the second transistor is a PMOS device, wherein the first gate dielectric comprises a third high-k layer having a dielectric constant of 8 or more, wherein the first high-k layer is a hafnium oxide layer, and wherein the second and third high-k layers are aluminum oxide layers, and wherein the first and second high-k layers are coplanar.

8. The semiconductor device as claimed in claim 7, wherein the first high-k layer is located between the first substrate region and the third high-k layer.

9. The semiconductor device as claimed in claim 7, wherein an interface layer between the first high-k layer and the third high-k layer is an alloy of materials of the first high-k layer and the third high-k layer.

10. A semiconductor device comprising:

a first transistor comprising a first substrate region, a first gate electrode, and a first gate dielectric located between the first substrate region and the first gate electrode; and a second transistor comprising a second substrate region, a second gate electrode, and a second gate dielectric located between the second substrate region and the second gate electrode;

wherein the first gate dielectric comprises a first high-k layer having a dielectric constant of 8 or more, wherein the second gate dielectric comprises a second high-k layer having a dielectric constant of 8 or more, and wherein the second high-k layer has a different material composition than the first high-k layer, wherein the first transistor is an NMOS device and the second transistor is a PMOS device, wherein the second gate dielectric comprises a third high-k layer having a dielectric constant of 8 or more, wherein the first and third high-k layers comprise hafnium and oxygen, and wherein the second high-k layer comprises aluminum and oxygen, and wherein the first and third high-k layers are coplanar.

11. The semiconductor device as claimed in claim 10, wherein the third high-k layer is located between the second substrate region and the second high-k layer.

12. The semiconductor device as claimed in claim 10, wherein the gate electrodes of each of the first transistor and the second transistor each comprise at least one of a metal and a metal nitride.

13. The semiconductor device as claimed in claim 10, wherein the gate electrodes of each of the first transistor and the second transistor each comprise at least one of a metal, a metal nitride and polysilicon.

14. The semiconductor device as claimed in claim 11, wherein each of the first and second high-k layers comprises nitrogen.

15. A semiconductor device comprising:

a first transistor comprising a first substrate region, a first gate electrode, and a first gate dielectric located between the first substrate region and the first gate electrode; and a second transistor comprising a second substrate region, a second gate electrode, and a second gate dielectric located between the second substrate region and the second gate electrode;

wherein the first gate dielectric comprises a first high-k layer having a dielectric constant of 8 or more, wherein the second gate dielectric comprises a second high-k layer having a dielectric constant of 8 or more, and wherein the second high-k layer has a different material composition than the first high-k layer, wherein the first transistor is an NMOS device and the second transistor is a PMOS device, wherein the second gate dielectric comprises a third high-k layer having a dielectric constant of 8 or more, wherein the first and third high-k layers comprise hafnium and oxygen, and wherein the second high-k layer comprises aluminum and oxygen, and wherein an intermediate layer between the second high-k layer and the third high-k layer is an alloy of materials of the second high-k layer and the third high-k layer.

16. The semiconductor device as claimed in claim 15, wherein a thickness of the first gate dielectric and the second gate dielectric is in a range of 1 to 60 Å.

* * * * *